US011074979B2

(12) United States Patent
Bayle

(10) Patent No.: US 11,074,979 B2
(45) Date of Patent: Jul. 27, 2021

(54) ERASE CONTROL CIRCUIT AND METHOD OF NON-VOLATILE SEMICONDUCTOR MEMORY DEVICE, AND NON-VOLATILE SEMICONDUCTOR MEMORY DEVICE

(71) Applicant: Powerchip Semiconductor Manufacturing Corporation, Hsinchu (TW)

(72) Inventor: Mathias Yves Gilbert Bayle, Tokyo (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/574,099

(22) Filed: Sep. 18, 2019

(65) Prior Publication Data

US 2020/0286565 A1 Sep. 10, 2020

(30) Foreign Application Priority Data

Mar. 7, 2019 (JP) .............................. JP2019-041682

(51) Int. Cl.
*G11C 16/14* (2006.01)
*G11C 16/34* (2006.01)
(Continued)

(52) U.S. Cl.
CPC .......... *G11C 16/14* (2013.01); *G11C 16/0483* (2013.01); *G11C 16/32* (2013.01); *G11C 16/3445* (2013.01)

(58) Field of Classification Search
CPC ..... G11C 16/0483; G11C 16/14; G11C 16/32; G11C 16/16; G11C 16/3445
(Continued)

(56) References Cited

U.S. PATENT DOCUMENTS 7,813,184 B2 10/2010 Kim et al.
7,889,562 B2 2/2011 Nobunaga
(Continued)

FOREIGN PATENT DOCUMENTS

CN 103236789 8/2013
JP 2017174482 9/2017
(Continued)

OTHER PUBLICATIONS

"Office Action of Taiwan Counterpart Application", dated Feb. 26, 2020, p. 1-p. 5.

*Primary Examiner* — Alfredo Bermudez Lozada
(74) *Attorney, Agent, or Firm* — JCIPRNET

(57) ABSTRACT

The erase voltage controlled with higher accuracy than the related art when erasing data in a non-volatile semiconductor memory device is provided. An control circuit for controlling an erase voltage includes: a slope adjustment circuit that controls a slope having a step shape by controlling a step voltage, a target voltage, and a step width of the erase voltage. The slope adjustment circuit repeatedly increases the erase voltage by the step voltage for each predetermined clock pulse control signal to the target voltage based on the step voltage and the target voltage, and outputs the clock pulse control signal to the erase voltage generation circuit by repeatedly clocking each time interval corresponding to the step width based on the step width.

4 Claims, 6 Drawing Sheets

(51) Int. Cl.
*G11C 16/32* (2006.01)
*G11C 16/04* (2006.01)

(58) Field of Classification Search
USPC ..................................................... 365/185.29
See application file for complete search history.

(56) References Cited

U.S. PATENT DOCUMENTS

| | | | |
|---|---|---|---|
| 8,873,293 | B1 | 10/2014 | Ou et al. |
| 8,891,308 | B1 | 11/2014 | Ou et al. |
| 9,852,800 | B2 | 12/2017 | Lang et al. |
| 10,102,912 | B2 | 10/2018 | Hahn |
| 2008/0074931 | A1* | 3/2008 | Kim ................... G11C 16/3445 |
| | | | 365/185.29 |
| 2011/0249506 | A1* | 10/2011 | Umezawa .............. G11C 16/14 |
| | | | 365/185.19 |

FOREIGN PATENT DOCUMENTS

| | | |
|---|---|---|
| TW | 200729732 | 8/2007 |
| TW | I407448 | 9/2013 |

* cited by examiner

ERASE CONTROL CIRCUIT AND METHOD OF NON-VOLATILE SEMICONDUCTOR MEMORY DEVICE, AND NON-VOLATILE SEMICONDUCTOR MEMORY DEVICE

CROSS-REFERENCE TO RELATED APPLICATION

This application claims the priority benefit of Japan application serial no. 2019-041682, filed on Mar. 7, 2019. The entirety of the above-mentioned patent application is hereby incorporated by reference herein and made a part of this specification.

BACKGROUND

Technical Field

The disclosure relates to an erase control circuit and an erase control method of a non-volatile semiconductor memory device (EEPROM) such as a flash memory, and a non-volatile semiconductor memory device.

Description of Related Art

A NAND type non-volatile semiconductor memory device is known, in which a NAND string is formed by connecting a plurality of memory cell transistors (hereinafter referred to as memory cells) in series between the bit line and the source line to realize high integration.

In a general NAND type flash memory, erasing is to apply a high voltage of 20V, for example, to the semiconductor substrate and apply 0V to the word line. Thereby, electrons are extracted from the floating gate which is a charge storage layer composed of polysilicon or the like, for example, and the threshold value is made lower than the erase threshold value (for example, −3V). On the other hand, in writing (programming), 0V is applied to the semiconductor substrate and a high voltage of 20V, for example, is applied to the control gate. Thereby, electrons are injected into the floating gate from the semiconductor substrate to make the threshold value higher than the write threshold value (for example, 1V). By applying a read voltage (for example, 0V) between the write threshold value and the read threshold value to the control gate, the memory cell taking these threshold values can determine its state based on whether a current flows through the memory cell.

In the flash memory configured as described above, when writing is performed on the memory cell to be written by a program operation, charges are injected into the floating gate of the memory cell transistor and the threshold voltage rises. As a result, even if a voltage equal to or lower than the threshold value is applied to the gate, the current does not flow and the state of writing the data "0" is achieved. Generally, the threshold voltage of the memory cell in the erase state has a variation and the process variation causes a variation in the write speed. Therefore, when a program operation is performed by applying a predetermined write voltage and verification is performed so that the threshold voltage is equal to or higher than the verification level, the threshold voltage of the memory cell after the writing has a distribution to an extent that is equal to or higher than the verification level.

By the way, the ISPP (Increment Step Pulse Program) method is used as a method of writing more effectively to a memory that has a large variation in write speed due to the process variation.

RELATED ART

Patent Documents

[Patent Document 1] Japanese Laid-open No. 2017-174482
[Patent Document 2] Specification of U.S. Pat. No. 8,891,308
[Patent Document 3] Specification of U.S. Pat. No. 8,873,293

SUMMARY

Problems to be Solved

Meanwhile, the operation of erasing the data stored in each memory cell of the NAND type flash memory is mainly realized by applying a predetermined high voltage pulse to the P well of the selected memory block based on the word line of the selected memory block. For the current NAND type flash memory, it is necessary to strictly control the shape of the high voltage pulse for erasing, and the memory cell is very sensitive to parameters such as the rise time, maximum voltage, and pulse width of erase voltage.

Since the NAND type flash memory supports 1 plane operation or 2 plane operation of the memory area, the analog circuit, such as the charge pump circuit that supplies the program voltage and the erase voltage, is designed for the worst load condition and specifically designed for the worst load condition during 2 plane operation. However, such a design method may have some adverse effects during 1 plane operation.

FIG. 1 is a block diagram showing a configuration example of a NAND type flash memory 100 according to a conventional example, and FIG. 2 is a graph showing a voltage waveform that shows the problem of the erase pulse according to the conventional example. In FIG. 1, the NAND type flash memory 100 includes a sequencer 1 controlling the operation of the entire memory, a voltage controller 2, an interface 3, an analog circuit 4 having a charge pump circuit 5, and a memory array 10. The memory array 10 includes a memory area having two planes (0) and (1), an X decoder circuit 22, and Y decoder circuits 23 and 24.

FIG. 2 shows the difference between the waveforms of the erase voltage Vers applied to the P well during the 1 plane operation and the 2 plane operation. The load on the P well in the 1 plane operation is twice as small as in the 2 plane operation. Thus, the rise time of the erase voltage Vers in the 1 plane operation comes faster than the rise time of the erase voltage Vers in the 2 plane operation. Therefore, as apparent from FIG. 2, there are problems that a slight overshoot occurs before the erase voltage Vers stabilizes and the performance of the memory cell drops.

In view of the above, the disclosure provides an erase control circuit and an erase control method of a non-volatile semiconductor memory device and a non-volatile semiconductor memory device that can control the erase voltage with higher accuracy than the related art when erasing data in the memory cell of the non-volatile semiconductor memory device.

Means for Solving the Problems

An erase control circuit of a non-volatile semiconductor memory device according to an embodiment of the disclosure is for controlling an erase voltage that erases data in a memory cell of the non-volatile semiconductor memory device. The erase control circuit includes: a slope adjustment circuit controlling a slope having a step shape by controlling a step voltage, a target voltage, and a step width of an erase pulse of the erase voltage based on the step voltage, the target voltage, and the step width of the erase pulse of the erase voltage, to generate the erase voltage.

In the erase control circuit of the non-volatile semiconductor memory device, the slope adjustment circuit includes: an erase voltage generation circuit that repeatedly increases the erase voltage by the step voltage for each predetermined clock pulse control signal to the target voltage based on the step voltage and the target voltage; and a time counter circuit that outputs the clock pulse control signal to the erase voltage generation circuit by repeatedly clocking each time interval corresponding to the step width based on the step width.

A non-volatile semiconductor memory device according to an embodiment of the disclosure includes the erase control circuit of the non-volatile semiconductor memory device.

An erase control method of a non-volatile semiconductor memory device according to an embodiment of the disclosure is for controlling an erase voltage that erases data in a memory cell of the non-volatile semiconductor memory device. The erase control method includes: controlling a slope having a step shape by controlling a step voltage, a target voltage, and a step width of an erase pulse of the erase voltage based on the step voltage, the target voltage, and the step width of the erase pulse of the erase voltage, to generate the erase voltage.

In the erase control method of the non-volatile semiconductor memory device, the step of generating the erase voltage includes: repeatedly increasing the erase voltage by the step voltage for each predetermined clock pulse control signal to the target voltage based on the step voltage and the target voltage; and outputting the clock pulse control signal by repeatedly clocking each time interval corresponding to the step width based on the step width.

Effects

Therefore, according to the disclosure, it is possible to control the erase voltage with higher accuracy than the related art when erasing data in the memory cell of the non-volatile semiconductor memory device. Thereby, it is possible to prevent occurrence of an overshoot before the erase voltage stabilizes and to prevent the performance of the memory cell from dropping.

DESCRIPTION OF THE EMBODIMENTS

Figure 1:
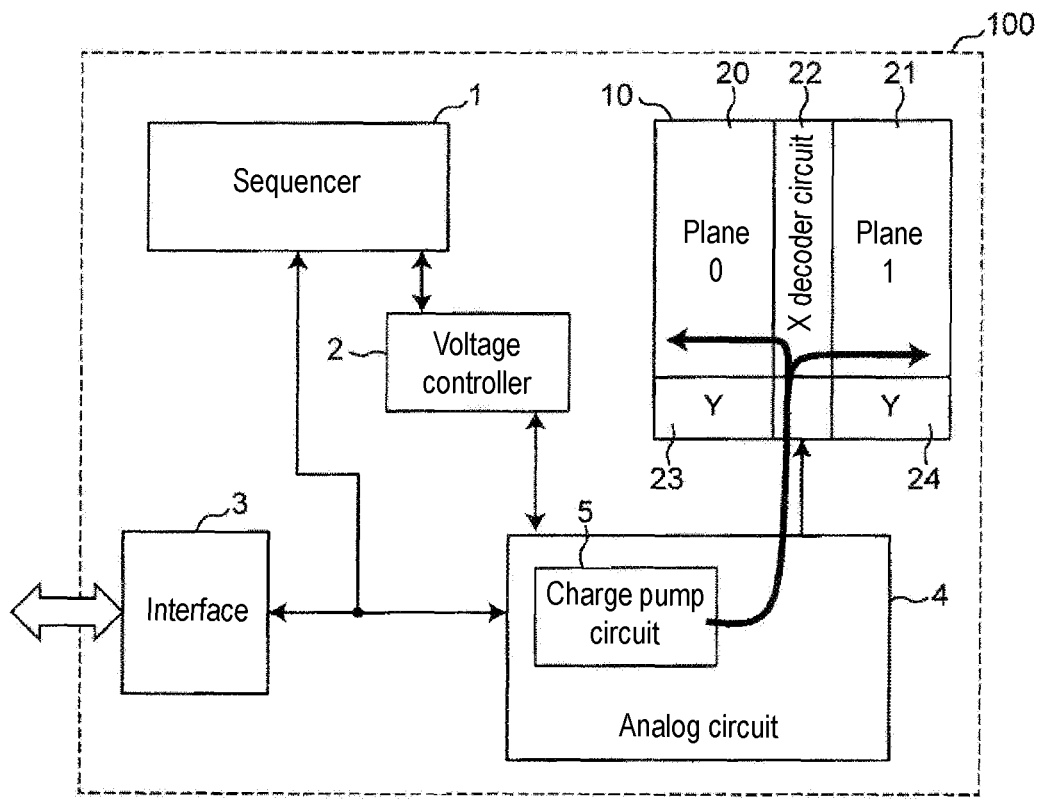
FIG. 1 is a block diagram showing a configuration example of a NAND type flash memory 100 according to a conventional example.
Figure 2:
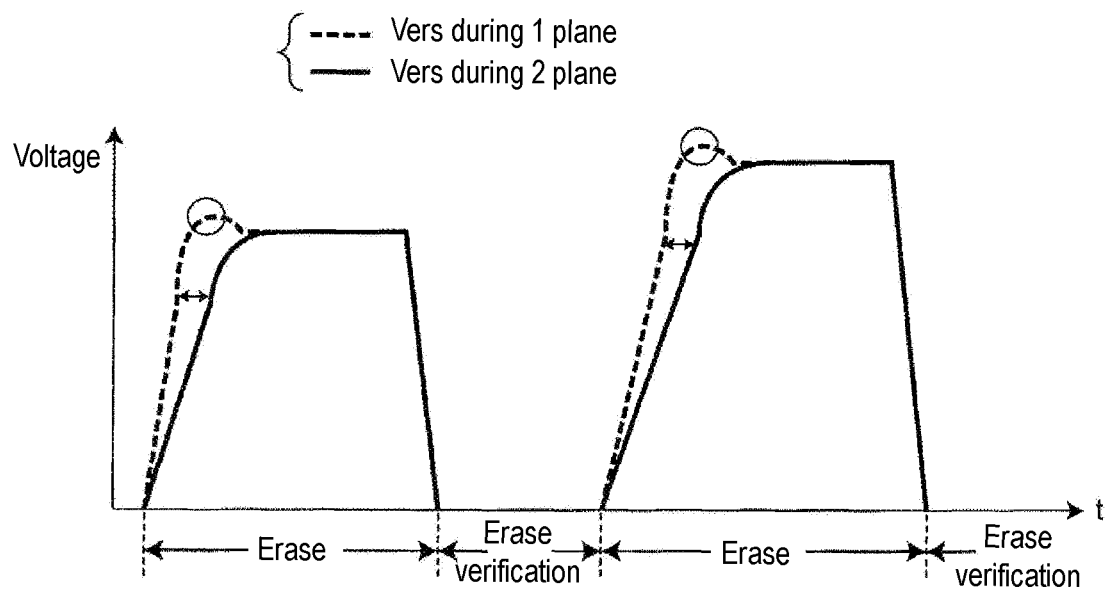
FIG. 2 is a graph showing a voltage waveform that shows the problem of the erase pulse according to the conventional example.

Hereinafter, an embodiment of the disclosure will be described with reference to the drawings. The same or similar components are denoted by the same reference numerals.

Figure 3:
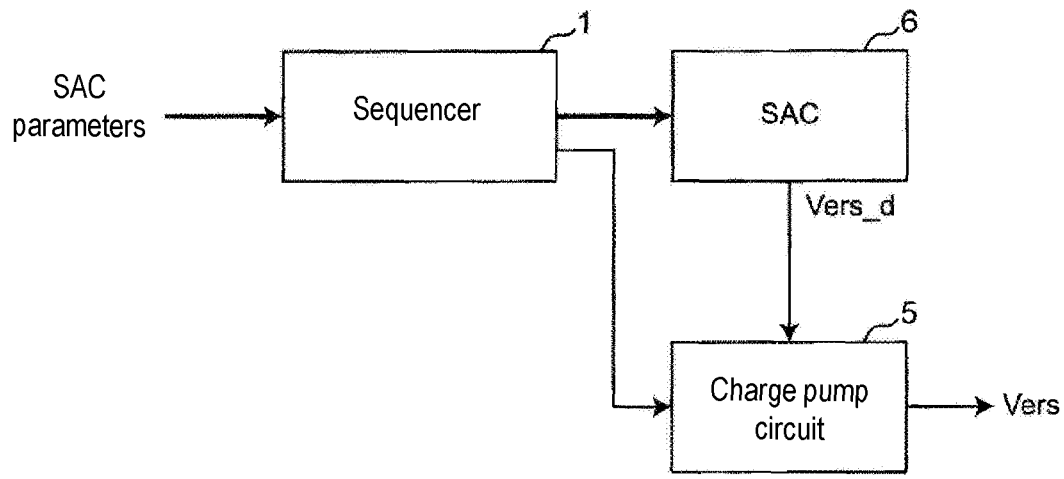
FIG. 3 is a block diagram showing a configuration example of the erase voltage generation control circuit according to an embodiment.
Figure 4:
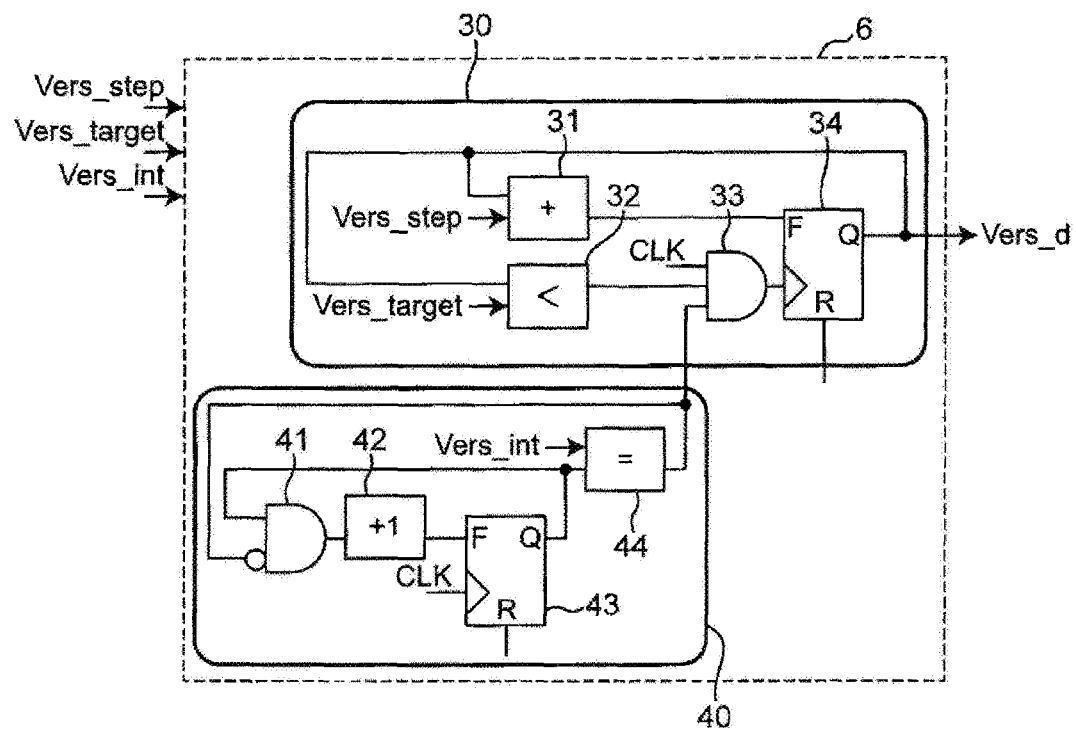
FIG. 4 is a circuit diagram showing a detailed configuration of the slope adjustment circuit 6 of FIG. 3.
Figure 5:
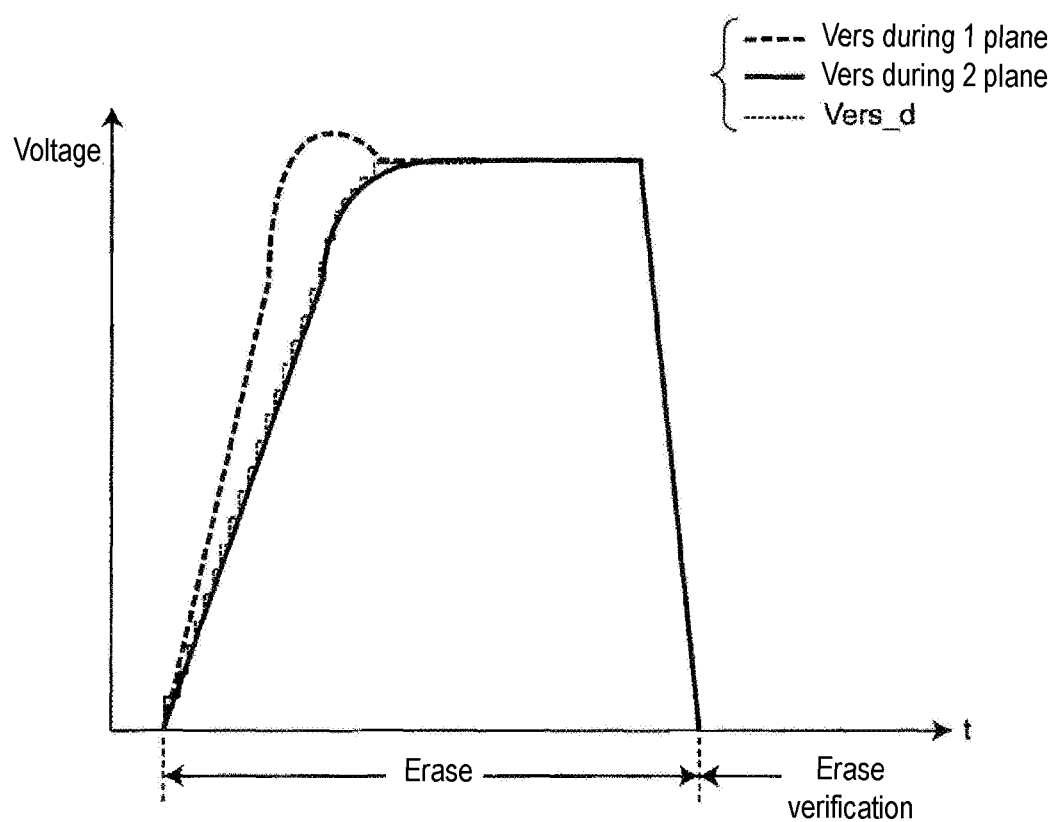
FIG. 5 is a graph showing an example of the erase pulse generated by the slope adjustment circuit 6 of FIG. 4.

FIG. 3 is a block diagram showing a configuration example of an erase voltage generation control circuit according to an embodiment, and FIG. 4 is a circuit diagram showing a detailed configuration of the slope adjustment circuit of FIG. 3. FIG. 5 is a graph showing an example of the erase pulse generated by the slope adjustment circuit of FIG. 4. In FIG. 5, the pulse having a step shape is the erase pulse according to the present embodiment, and the other waveforms are comparative examples.

In FIG. 3, the erase voltage generation control circuit includes a sequencer 1, a slope adjustment circuit (hereinafter referred to as SAC) 6, and a charge pump circuit 5. The sequencer 1 is, for example, a control circuit that controls the overall operation of a NAND type flash memory 200 (FIG. 7), and the sequencer 1 receives the following SAC parameters (parameters for slope control of the erase pulse voltage) and sets them to the SAC 6 and then instructs the charge pump circuit 5 to generate an erase voltage at the time of erasing data:

(1) step voltage Vers_step;
(2) target voltage Vers_target; and
(3) step width Vers_int.

The erase voltage generation control circuit of FIG. 3 controls the slope of the erase pulse voltage that has a step shape. Specifically, the erase pulse voltage is generated by the SAC 6 so as to keep the rise time of the erase pulse voltage constant and prevent occurrence of an overshoot. The sequencer 1, which is the main logic, controls the SAC 6 to set the time (step width) and voltage (step voltage) of each step. Here, the SAC parameters are loaded from the memory location of a fuse data area 10F in the memory array 10, for example, from the sequencer 1 to the SAC 6 in a power-on sequence when the NAND type flash memory 200 is powered on or reset. Then, the step voltage and the step width during the rise period of the erase voltage Vers are adjusted. In FIG. 3, Vers_d is a digital signal bus that provides the voltage code Vers_d to the analog charge pump circuit 5. The charge pump circuit 5 generates and outputs the corresponding erase voltage Vers based on the inputted voltage code Vers_d.

FIG. 4 is a circuit diagram showing a detailed configuration of the SAC 6 of FIG. 3.

In FIG. 4, the SAC 6 includes an erase voltage generation circuit 30 and a time counter circuit 40. The erase voltage generation circuit 30 includes an adder 31, a comparator 32, an AND gate 33, and a delayed flip-flop 34. The time counter circuit 40 includes an AND gate 41, an adder 42, a delayed flip-flop 43, and a comparator 44.

The three SAC parameters from the sequencer 1 are inputted to the adder 31, the comparator 32, and the comparator 44. That is, the step voltage Vers_step is inputted to the adder 31, the target voltage Vers_target is inputted to the comparator 32, and the step width Vers_int is inputted to the comparator 44.

The time counter circuit 40 is a circuit for generating a step clock for generating the erase pulse voltage. In the time counter circuit 40, the AND gate 41 performs an AND operation of the output data from the delayed flip-flop 43 and the inverted data of the output data from the comparator 44, and outputs the data of the operation result to the adder 42. The adder 42 adds 1 to the inputted data and then outputs the data of the addition result to the delayed flip-flop 43. The delayed flip-flop 43 temporarily stores the data inputted from the adder 42 to the input terminal according to an external clock after being reset by an external reset signal, and then outputs it to the comparator 44. The comparator 44 outputs a positive clock pulse control signal to the AND gate 33 when the data from the delayed flip-flop 43 matches the step width Vers_int.

In the erase voltage generation circuit 30, the adder 31 adds the output data from the delayed flip-flop 34 and the inputted step voltage Vers_step, and outputs the data of the addition result to the delayed flip-flop 34. Meanwhile, the comparator 32 compares the output data from the delayed flip-flop 34 with the inputted target voltage Vers_target, and outputs a positive pulse signal to the AND gate 33 when the former data becomes smaller than the latter data. The AND gate 33 performs an AND operation of the pulse signal from the comparator 32, the clock pulse control signal from the comparator 44, and the external clock, and outputs a signal of the operation result to the clock terminal of the delayed flip-flop 34. After being reset by the external reset signal, the delayed flip-flop 34 outputs the inputted data in synchronization with the clock from the AND gate 33 as the voltage code (Vers_d).

In the SAC 6 configured as described above, the parameters of the step width Vers_int, the step voltage Vers_step, and the target voltage Vers_target are received from the sequencer 1, and every time the data counted by the time counter circuit 40 is incremented by 1, the adder 31 of the step voltage Vers_step is activated and increments the voltage code Vers_d until the voltage code Vers_d reaches the target voltage Vers_target.

Figure 6:
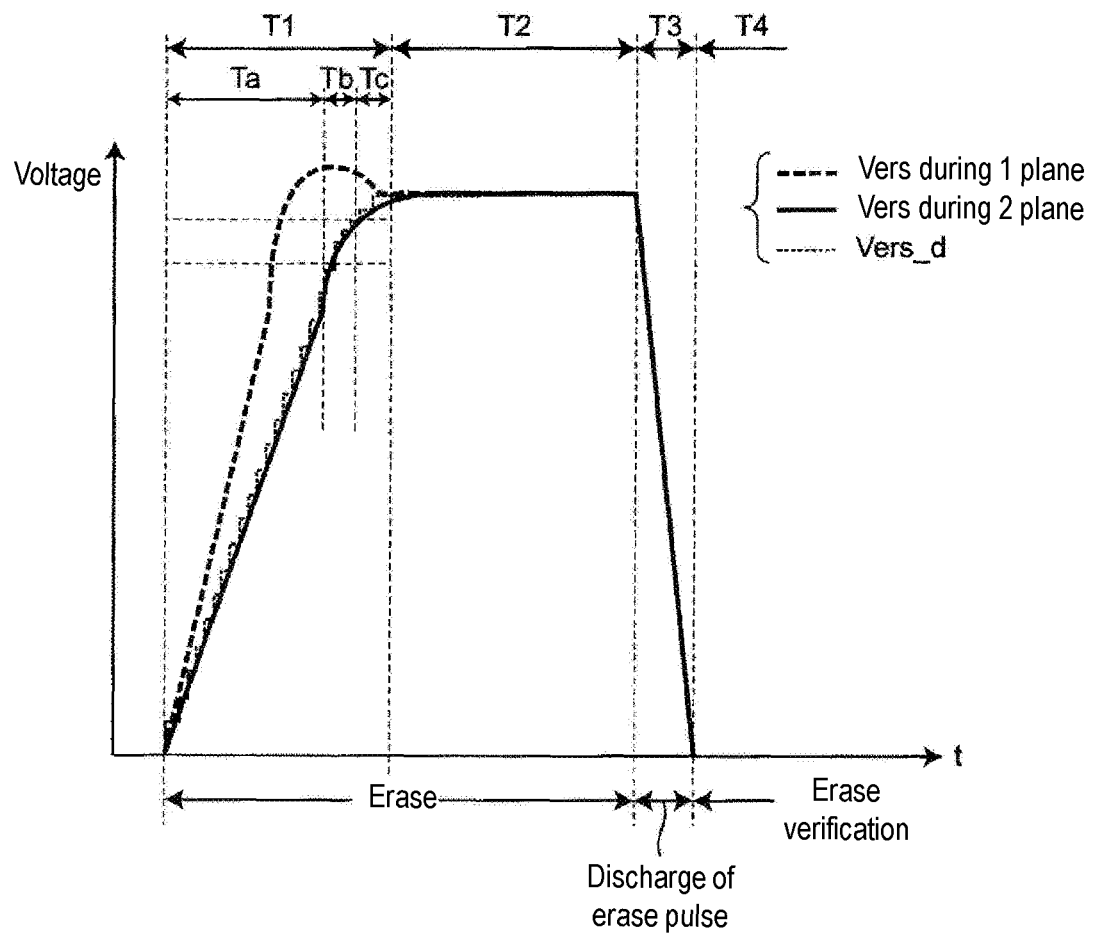
FIG. 6 is a graph showing an example of the erase pulse generated by the slope adjustment circuit 6 of FIG. 4.
Figure 7:
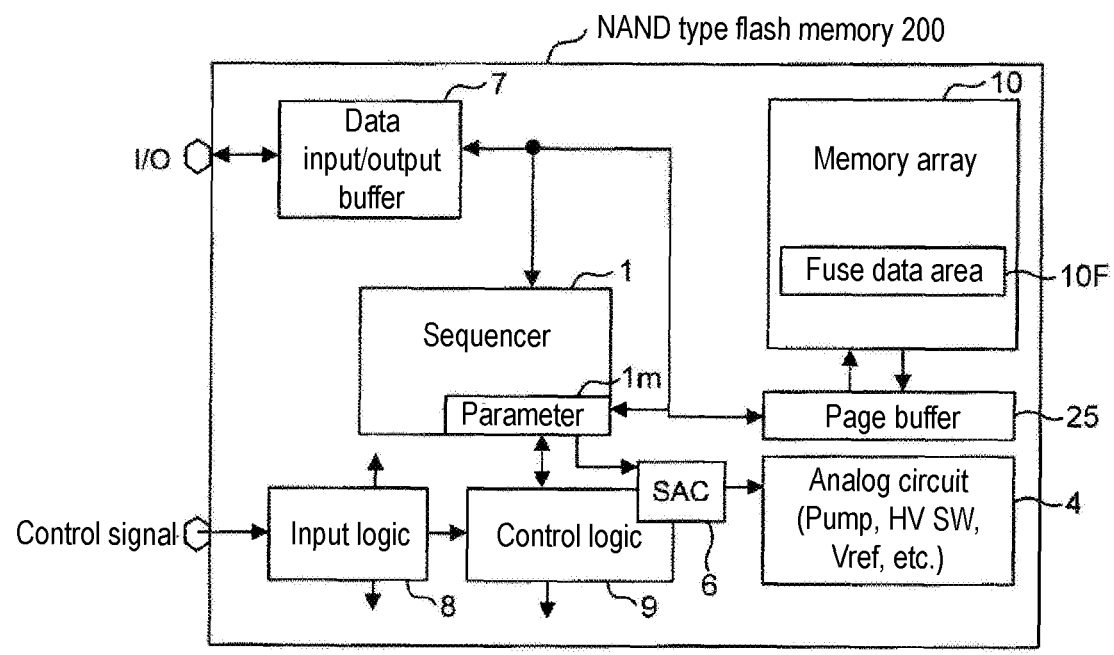
FIG. 7 is a block diagram showing a configuration example of the NAND type flash memory 200 according to an embodiment.

FIG. 6 is a graph showing an example of the erase pulse generated by the SAC 6 of FIG. 4. FIG. 7 is a block diagram showing a configuration example of a NAND type flash memory 200 according to an embodiment.

In FIG. 7, the NAND type flash memory 200 includes a sequencer 1 having a parameter memory 1m, an analog circuit 4 having a charge pump circuit, etc., a SAC 6, a data input/output buffer 7, an input logic 8, a control logic 9, and a memory array 10 having a fuse data area 10F.

In FIG. 7, the data input/output buffer 7 outputs the data inputted from an external device to the sequencer 1, and while it is written to the memory array 10 via a page buffer 25, the data from the memory array 10 is read from the memory array 10 via the page buffer 25 and then outputted from the data input/output buffer 7 to the external device. The input logic 8 inputs a control signal from the external device and controls internal circuits such as the sequencer 1 and the control logic 9 based thereon. The control logic 9 controls the operations of the memory array 10 and its peripheral circuits based on the control signal from the input logic.

The sequencer 1 controls the operation of the SAC 6 based on the SAC parameters stored in the parameter memory 1m. Specifically, the erase pulse voltage Vers is adjusted by controlling the SAC 6 based on the step voltage Vers_step, the target voltage Vers_target, and the step width Vers_int which are the SAC parameters. The SAC parameters are configured to be changeable during the rise time of each step pulse.

Next, the SAC parameters will be described in detail below.

Evaluation of the erase operation is performed in the early stage of product development of the flash memory, and at that time, various SAC parameters are directly inputted and stored in the parameter memory 1m of the sequencer 1 via the data input/output buffer 7 by using the test mode, and then the optimal SAC parameters are determined. Then, once the optimal SAC parameters are determined, they are written from the parameter memory 1m to the fuse data area 10F in the memory array 10 via the page buffer 25 by using the test mode. Here, the SAC parameters are assumed to be set for the worst load (a case where multiple planes are selected) and then applied to all cases (up to selection of a single plane). In the normal user mode, every time the NAND type flash memory 200 is powered on, the SAC parameters are automatically loaded from the fuse data area 10F in the memory array 10 to the parameter memory 1m of the sequencer 1 via the page buffer 25.

Figure 8:
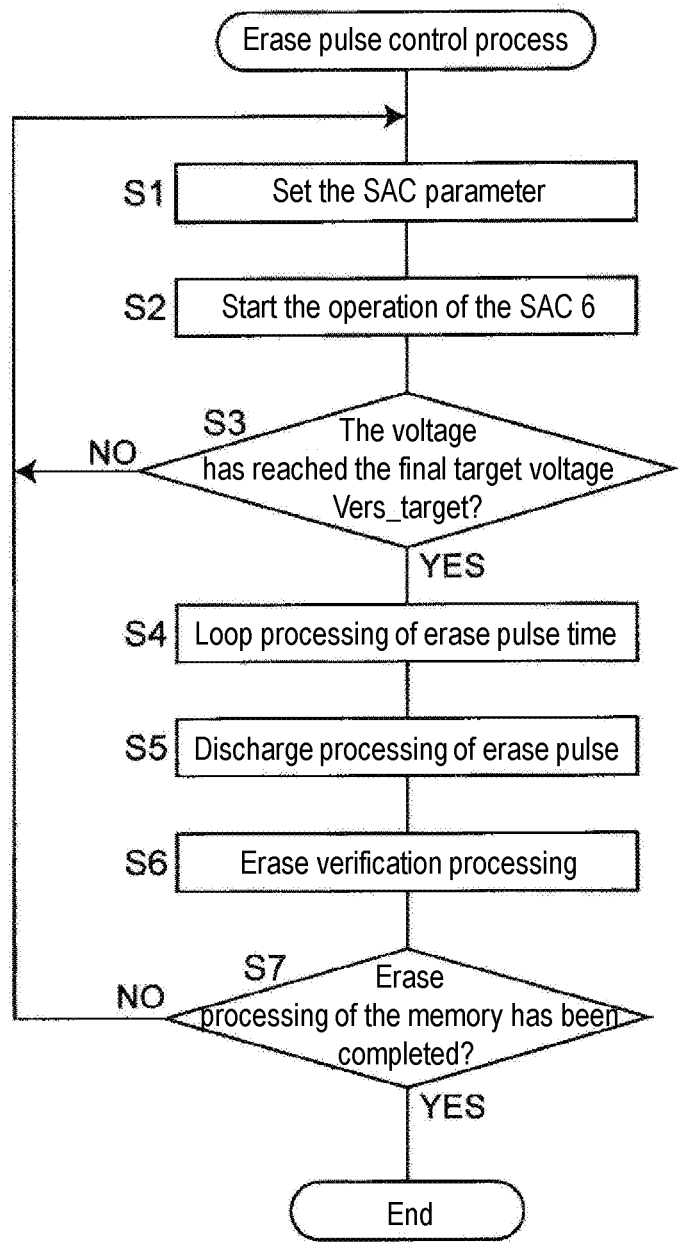
FIG. 8 is a flowchart showing the erase pulse control process executed by the sequencer 1 of FIG. 7.

FIG. 8 is a flowchart showing an erase pulse control process executed by the sequencer 1 of FIG. 7.

In step S1 of FIG. 8, a predetermined SAC parameter is set from the parameter memory 1m of the sequencer 1, and the operation of the SAC 6 is started based on the SAC parameter set in step S2. In step S3, it is determined whether the voltage of the voltage code (Vers_d) has reached the final target voltage Vers_target (referred to as the target voltage Vers_target of the period T3 in the example of FIG. 6). If the result is YES, the process proceeds to step S4, and if the result is NO, the process returns to step S1 and repeats the processing of steps S1 to S3. Here, the processing of steps S1 to S3 is the processing of the period T1 of FIG. 6 and is divided into three divided periods Ta, Tb, and Tc, for example. By setting different SAC parameters to make the step-shaped erase voltage substantially close to the curve of the erase voltage Vers during 2 plane in each of the divided periods Ta, Tb, and Tc, the step-shaped erase voltage can be set to reduce the rise time without causing an overshoot.

Next, in step S4, a predetermined erase voltage is held by executing "loop processing of erase pulse time" corresponding to the period T2 of FIG. 6. In step S5, by executing "discharge processing of erase pulse", the voltage is discharged to drop from the held erase voltage toward 0V. In step S6, by executing "erase verification processing", the data of the erased memory cell is verified. In step S7, it is determined whether the erase processing of the memory has been completed. If the result is YES, the control process of the erase pulse is ended, and if the result is NO, the process returns to step S1 and repeats the processing from step S1.

As described above, according to the present embodiment, by using the SAC 6 to control the step voltage Vers_step, the target voltage Vers_target, and the step width Vers_int of the erase pulse, the erase voltage can be controlled to generate an erase pulse that has higher accuracy than the related art, so as to erase the data in the memory cell. Thus, it is possible to prevent occurrence of an overshoot before the erase voltage stabilizes, and to prevent the performance of the memory cell from dropping.

Modified Example

The above embodiment illustrates an erase voltage control circuit for a NAND type flash memory. However, the disclosure is not limited thereto, and the disclosure can also be applied to other types of non-volatile semiconductor memory devices.

In the above embodiment, the time counter circuit 40, which is a digital circuit, is used to notify that the target voltage has been reached. However, the disclosure is not limited thereto, and the erase pulse voltage may be incremented step by step using an analog feedback signal obtained through DA conversion of the voltage code.

Differences from the Patent Documents

Differences from Patent Document 2

In Patent Document 2, although the gradient between the program pulses is controlled, there is no disclosure or suggestion about controlling the voltage, etc. of the erase pulse.

Differences from Patent Document 3

In Patent Document 3, although the gradient of the program voltage is controlled, there is no disclosure or suggestion about controlling the voltage, etc. of the erase pulse.

Field of Industrial Application

As described in detail above, according to the disclosure, it is possible to control the erase voltage with higher accuracy than the related art when erasing data in the memory cell of the non-volatile semiconductor memory device. Thus, it is possible to prevent occurrence of an overshoot before the erase voltage stabilizes, and to prevent the performance of the memory cell from dropping.

What is claimed is:

1. An erase control circuit of a non-volatile semiconductor memory device, which controls a slope of an erase voltage that erases data in a memory cell of the non-volatile semiconductor memory device, wherein a rise time of the erase voltage comprises a plurality of divided periods, the erase control circuit comprising:

a slope adjustment circuit, setting a plurality of parameter sets of the slope adjustment circuit corresponding to the divided periods, dynamically adjusting the slope having a step shape by adjusting a step voltage, a target voltage, and a step width of an erase pulse of the erase voltage during each divided period based on a corresponding parameter set of the slope adjustment circuit, to generate the erase voltage, wherein the parameter set of the slope adjustment circuit comprises the step voltage, the target voltage, and the step width of the erase pulse of the erase voltage, wherein the slope adjustment circuit compares the target voltage with an output of the slope adjustment circuit to generate a comparison result, and the erase voltage is increased stepwise to the target voltage based on the comparison result and the step voltage.

2. The erase control circuit of the non-volatile semiconductor memory device according to claim 1, wherein the slope adjustment circuit comprises:

an erase voltage generation circuit that repeatedly increases the erase voltage by the step voltage for each predetermined clock pulse control signal to the target voltage based on the step voltage and the target voltage; and a time counter circuit that outputs the clock pulse control signal to the erase voltage generation circuit by repeatedly clocking each time interval corresponding to the step width based on the step width.

3. An erase control method of a non-volatile semiconductor memory device for controlling a slope of an erase voltage that erases data in a memory cell of the non-volatile semiconductor memory device, wherein a rise time of the erase voltage comprises a plurality of divided periods, the erase control method comprising:

setting a plurality of parameter sets of the slope adjustment circuit corresponding to the divided periods;

dynamically adjusting the slope having a step shape by adjusting a step voltage, a target voltage, and a step width of an erase pulse of the erase voltage during each divided period based on a corresponding parameter set of the slope adjustment circuit, to generate the erase voltage, wherein the parameter set of the slope adjustment circuit comprises the step voltage, the target voltage, and the step width of the erase pulse of the erase voltage, wherein a slope adjustment circuit of the non-volatile semiconductor memory device compares the target voltage with an output of the slope adjustment circuit to generate a comparison result, and the erase voltage is increased stepwise to the target voltage based on the comparison result and the step voltage.

4. The erase control method of the non-volatile semiconductor memory device according to claim 3, wherein the step of generating the erase voltage comprises:

repeatedly increasing the erase voltage by the step voltage for each predetermined clock pulse control signal to the target voltage based on the step voltage and the target voltage; and outputting the clock pulse control signal by repeatedly clocking each time interval corresponding to the step width based on the step width.

* * * * *